United States Patent
Kammler et al.

(10) Patent No.: US 7,494,906 B2
(45) Date of Patent: Feb. 24, 2009

(54) TECHNIQUE FOR TRANSFERRING STRAIN INTO A SEMICONDUCTOR REGION

(75) Inventors: Thorsten Kammler, Ottendorf-Okrilla (DE); Martin Gerhardt, Dresden (DE); Frank Wirbeleit, Freiberg (DE)

(73) Assignee: Advanced Micro Devices, Inc., Austin, TX (US)

( * ) Notice: Subject to any disclaimer, the term of this patent is extended or adjusted under 35 U.S.C. 154(b) by 329 days.

(21) Appl. No.: 11/112,498

(22) Filed: Apr. 22, 2005

(65) Prior Publication Data

US 2006/0003510 A1   Jan. 5, 2006

(30) Foreign Application Priority Data

Jun. 30, 2004   (DE) .................. 10 2004 031 710

(51) Int. Cl.
*H01L 21/8238* (2006.01)
*H01L 21/425* (2006.01)

(52) U.S. Cl. .................. 438/528; 438/520; 438/938; 257/E21.335

(58) Field of Classification Search .................. 257/369, 257/372, E21.135, E21.328, E21.329, E21.335; 438/232, 520, 528, 938
See application file for complete search history.

(56) References Cited

U.S. PATENT DOCUMENTS

| | | | |
|---|---|---|---|
| 6,335,233 B1 * | 1/2002 | Cho et al. ................ | 438/199 |
| 6,583,000 B1 | 6/2003 | Hsu et al. ................ | 438/222 |
| 6,800,887 B1 * | 10/2004 | Weber et al. ............. | 257/285 |
| 6,803,270 B2 * | 10/2004 | Dokumachi et al. ...... | 438/231 |
| 7,169,675 B2 * | 1/2007 | Tan et al. ................. | 438/301 |
| 7,227,205 B2 * | 6/2007 | Bryant et al. ............ | 257/288 |
| 7,361,570 B1 * | 4/2008 | Liu .......................... | 438/423 |
| 2003/0201468 A1 * | 10/2003 | Christiansen et al. .... | 257/200 |
| 2004/0018701 A1 * | 1/2004 | Ueda ....................... | 438/518 |
| 2004/0058482 A1 * | 3/2004 | Yoshida et al. .......... | 438/149 |
| 2004/0075148 A1 * | 4/2004 | Kumagai et al. ......... | 257/369 |
| 2004/0142537 A1 * | 7/2004 | Lee et al. ................ | 438/424 |

(Continued)

FOREIGN PATENT DOCUMENTS

DE    102 18 381 A1    2/2004

(Continued)

OTHER PUBLICATIONS

Trinkhaus, H. et al. "Strain Relaxation Mechanism for Hydrogen-Implanted Si1-xGex/Si(100) Heterostructures." Appl. Phys. Lett. vol. 76 (2000): pp. 3552-3554.*

(Continued)

*Primary Examiner*—Douglas M Menz
*Assistant Examiner*—Matthew W Such
(74) *Attorney, Agent, or Firm*—Williams, Morgan & Amerson, P.C.

(57) ABSTRACT

A dislocation region is formed by implanting a light inert species, such as hydrogen, to a specified depth and with a high concentration, and by heat treating the inert species to create "nano" bubbles, which enable a certain mechanical decoupling to underlying device regions, thereby allowing a more efficient creation of strain that is induced by an external stress-generating source. In this way, strain may be created in a channel region of a field effect transistor by, for instance, a stress layer or sidewall spacers formed in the vicinity of the channel region.

35 Claims, 5 Drawing Sheets

U.S. PATENT DOCUMENTS

2004/0159834 A1* 8/2004 Huang et al. .................. 257/18
2005/0003605 A1* 1/2005 Dokumaci et al. .......... 438/231
2005/0247926 A1* 11/2005 Sun et al. ..................... 257/19
2006/0148155 A1* 7/2006 Coleman .................... 438/199

FOREIGN PATENT DOCUMENTS

WO    WO 0247167 A1 * 12/2001
WO    WO 0247167 A1 *  6/2002

OTHER PUBLICATIONS

Fuchtner, P.F.P., et al. "Overpressurized Bubbles Versus Voids Formed in Helium Implanted and Annealed Silicon." Appl. Phys. Lett., vol. 70, No. 6 (Feb. 10, 1997): pp. 732-734.*

* cited by examiner

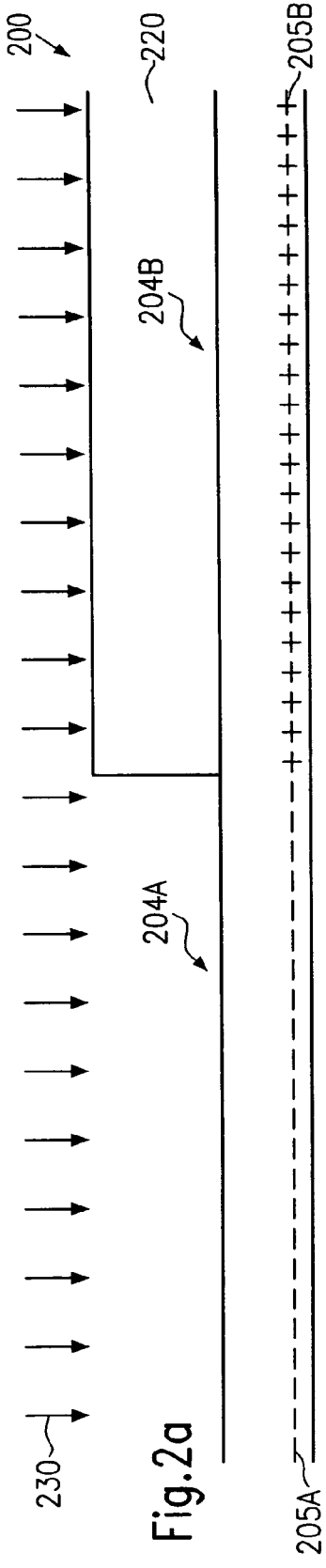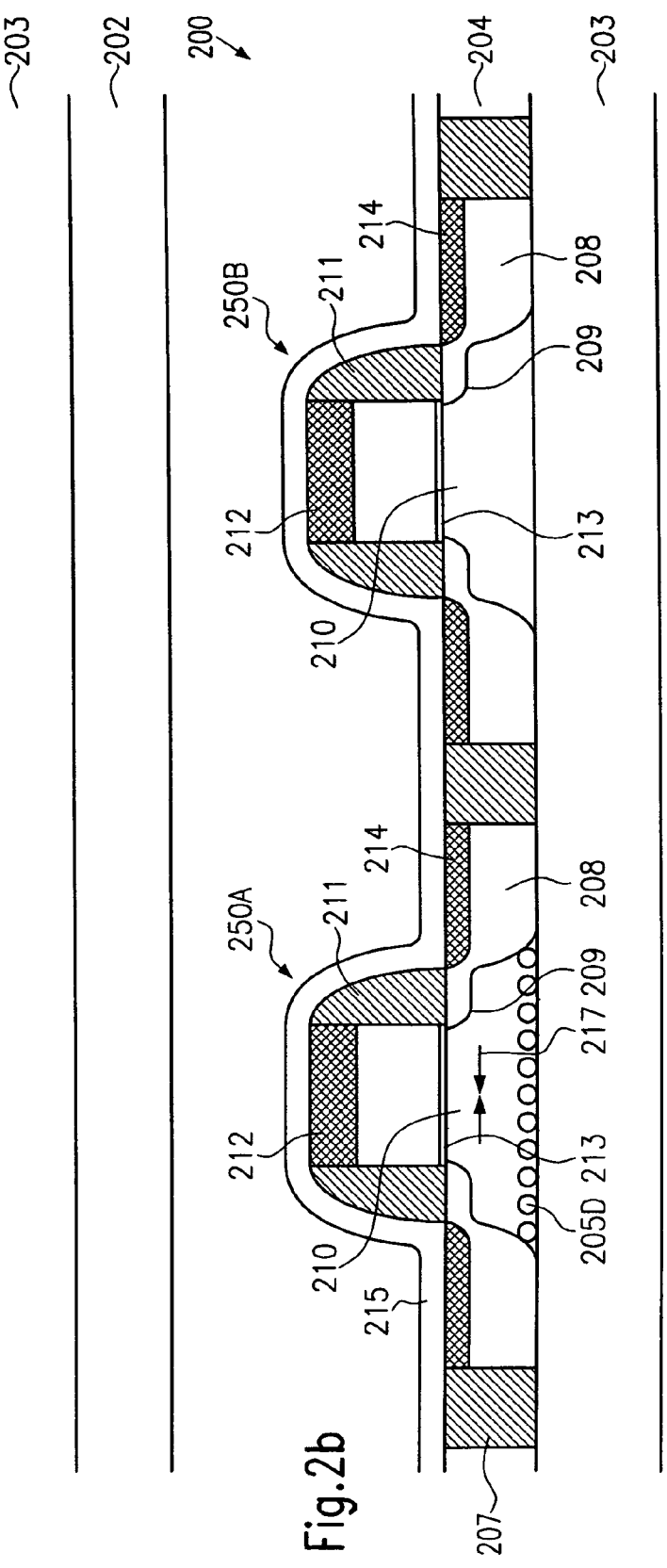

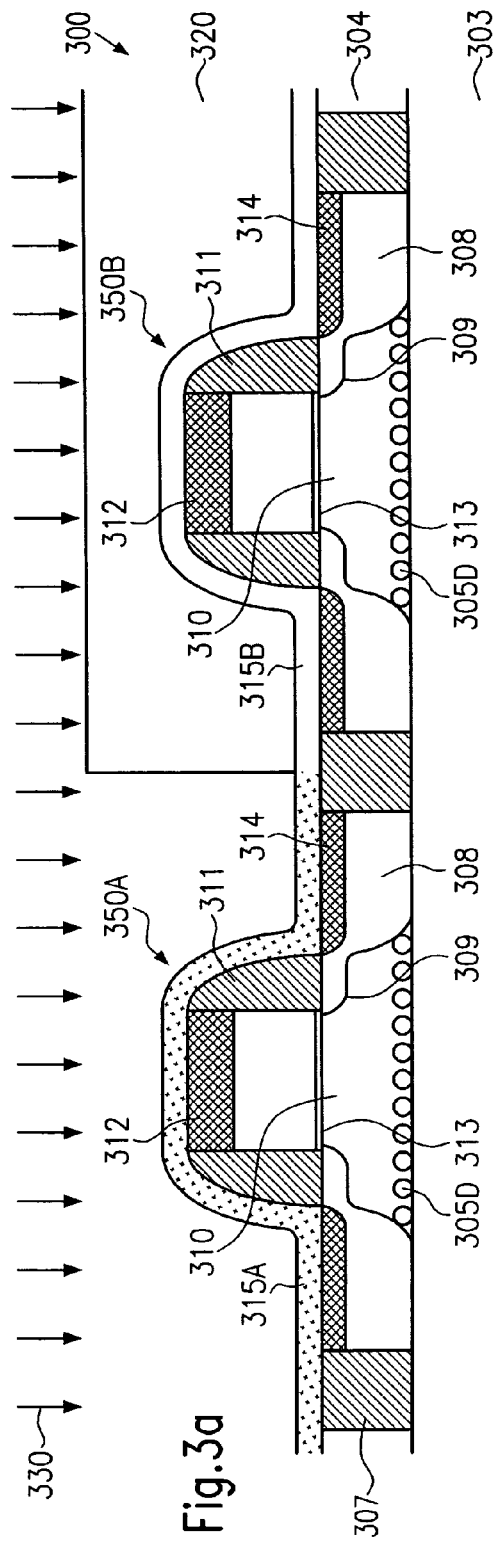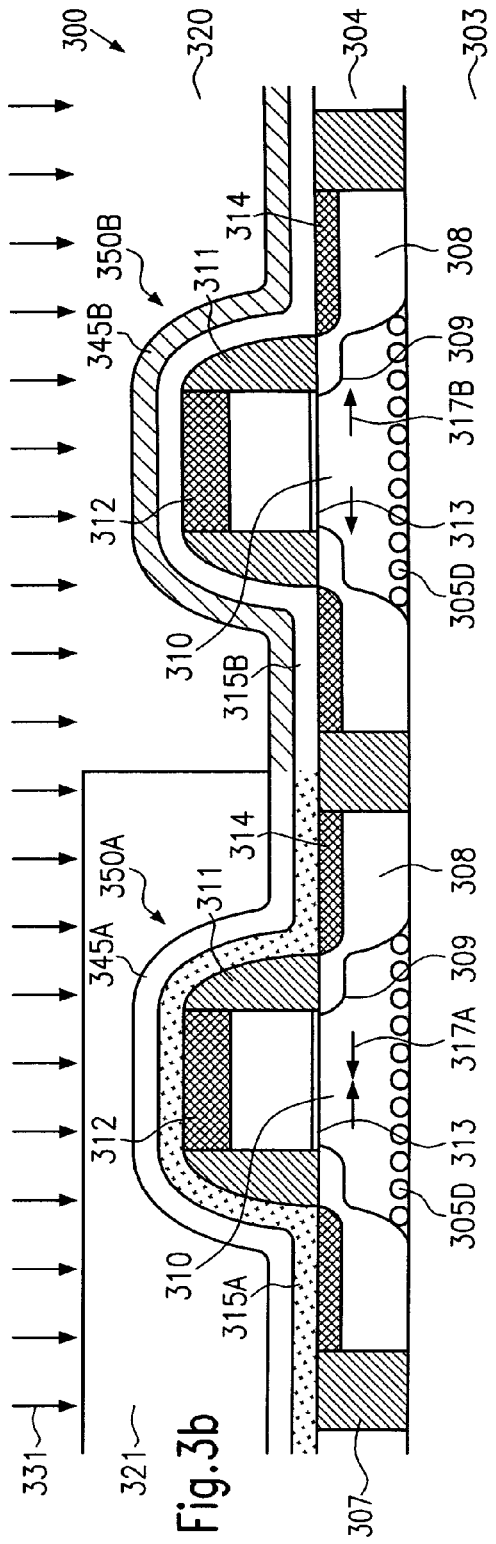

TECHNIQUE FOR TRANSFERRING STRAIN INTO A SEMICONDUCTOR REGION

BACKGROUND OF THE INVENTION

1. Field of the Invention

Generally, the present invention relates to the formation of integrated circuits, and, more particularly, to the formation of semiconductor regions of increased charge carrier mobility, such as a channel region of a field effect transistor, by creating strain in the semiconductor region.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, MOS technology is currently the most promising approach due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region upon formation of a conductive channel, due to the application of an appropriate control voltage to the gate electrode, depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction, as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance device performance of the transistor elements by increasing the charge carrier mobility in the channel region for a given channel length, thereby offering the potential for achieving a performance improvement that is comparable with the advance to a future technology node while avoiding many of the above process adaptations associated with device scaling. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby presently making a reduction of the dopant concentration a less attractive approach unless other mechanisms are developed to adjust a desired threshold voltage. Second, the lattice structure in the channel region may be modified, for instance by creating tensile or compressive stress to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 120% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor, which may enable the fabrication of fast, powerful semiconductor devices without requiring expensive semiconductor materials and manufacturing techniques.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow to form the germanium or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like is used in an attempt to create a desired strain within the channel region. However, the process of creating the strain in the channel region by applying a specified external stress suffers from a highly inefficient translation of the external stress into strain in the channel region, since the channel region is strongly bonded to the buried insulating layer in silicon-on-insulator (SOI) devices or the remaining bulk silicon in bulk devices. Hence, although providing significant advantages over the above-discussed approach requiring additional stress layers within the channel region, the moderately low strain obtained renders the latter approach less attractive.

In view of the above-described situation, there exists a need for an alternative technique that enables the creation of desired stress conditions in the transistor structure without requiring complex and expensive epitaxial growth techniques or variations of critical manufacturing steps.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a strained semiconductor region, in particular a strained channel region of a field effect transistor, in that a certain degree of mechanical decoupling is provided between the semiconductor region, or a portion thereof, and a substrate on which the semiconductor region is formed. To achieve the mechanical decoupling, at least to a specified degree, a dislocation region is formed that at least significantly weakens the bonding of the semiconductor region under consideration to the device region below the semiconductor region of interest so that any external stress transferred to the semiconductor region under consideration may effectively be translated into a corresponding strain, thereby significantly affecting the charge carrier mobility within the semiconductor region. Hereby, the stress created externally from the semiconductor region of interest may be supplied temporarily or permanently to correspondingly adjust, for instance, the performance of a field effect transistor by increasing the on-current of the transistor, substantially without negatively affecting the static characteristics thereof.

According to one illustrative embodiment of the present invention, a method comprises providing a semiconductor region above a substrate and forming a dislocation region in at least one of the substrate and the semiconductor region, wherein the dislocation region enables a relative motion on an atomic scale between the substrate and at least a portion of the semiconductor region. Moreover, a stress-inducing region is formed that is mechanically coupled to the semiconductor region, wherein the stress-inducing region creates strain, at least in that portion of the semiconductor region.

According to a further illustrative embodiment of the present invention, a method comprises implanting a light inert ion species through a semiconductor region into a substrate at a specified depth. Moreover, the method comprises forming a transistor element above the specified depth, wherein the transistor element has a drain region, a source region, a channel region comprised of the semiconductor region and a gate electrode structure. Finally, a heat treatment is performed with the substrate to form a dislocation region adjacent to the channel region, wherein the dislocation region enables a relative motion on an atomic scale between the substrate and at least a portion of the channel region.

In accordance with yet another illustrative embodiment of the present invention, a semiconductor device comprises a substrate, a strained semiconductor region located above the substrate and a dislocation region. The dislocation region is formed between the substrate and the strained semiconductor region, and enables a relative motion on an atomic scale between the substrate and at least a portion of the strained semiconductor region.

BRIEF DESCRIPTION OF THE DRAWINGS

The invention may be understood by reference to the following description taken in conjunction with the accompanying drawings, in which like reference numerals identify like elements, and in which:

FIGS. 2a-2b schematically show cross-sectional views of a semiconductor device in which a dislocation region is formed in a selective fashion in accordance with further illustrative embodiments;

FIGS. 3a-3b schematically show cross-sectional views of a semiconductor device comprising two transistor elements having different strains in their respective channel regions in accordance with further illustrative embodiments.

Figure 1A:
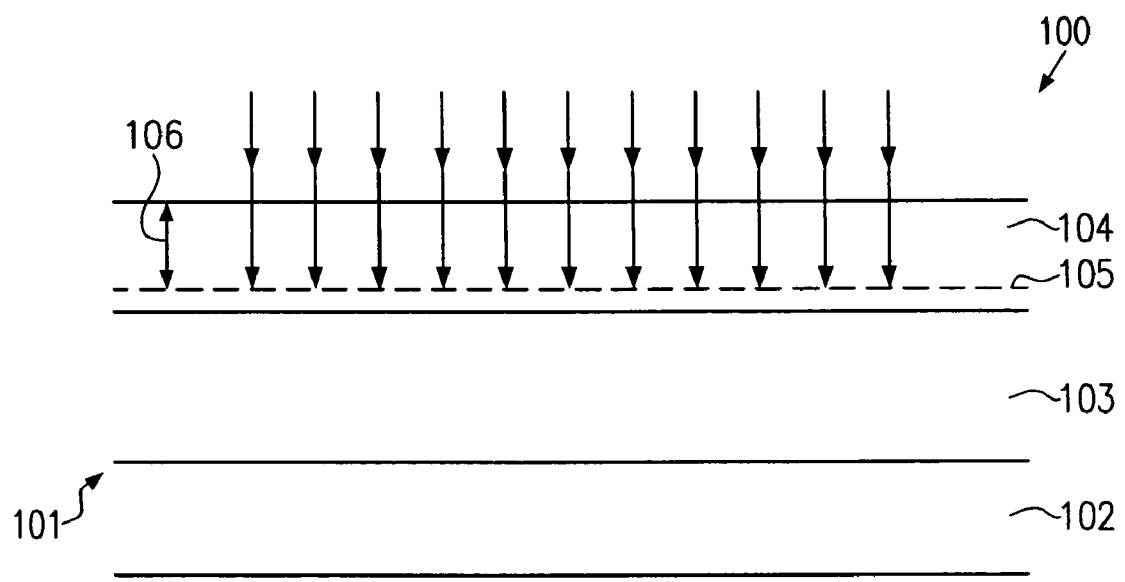
FIGS. 1a-1d schematically show cross-sectional views of a semiconductor device during various manufacturing stages, wherein a dislocation region is formed between a semiconductor region and a substrate to enable an effective creation of strain induced by externally-supplied stress in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that strain may be created within a portion of interest of a semiconductor region by weakening the bonding of the portion of interest to a device region located below the portion of interest. Due to the decreased mechanical coupling of the semiconductor region to the lower lying device region or substrate, an externally-generated stress, which may be created by any appropriate means, such as sidewall spacers of a gate electrode structure, an etch stop layer for an interlayer dielectric and the like, may be highly efficiently transferred into the semiconductor region of interest, which may then correspondingly deform since the weakened bonding or the mechanical decoupling allows, to a certain degree, a relative motion between the particles forming the crystal lattice of the semiconductor region and the lower lying device region or substrate. Hereinafter, a region enabling a relative motion on an atomic scale of two device regions adjacent to this region is referred to as a dislocation region since it enables a certain dislocation of the two regions, which enclose the dislocation region. It should be noted that here the term "dislocation" is meant to describe a change in the relative position of a small volume element of one region with respect to a corresponding small volume element of an adjacent region, wherein the relative position change may correspond to a deformation, such as tensile deformation or strain, or compressive deformation or strain, rather than a uniform translation of one region in its entirety with respect to the other region. For example, a region comprising a plurality of voids having a size on the order of magnitude of nanometers, which is sandwiched by two device regions substantially without any voids, may be considered as a dislocation region, since the "nano-voids" enable a relative motion between the two substantially void-free regions on an atomic scale upon the influence of an external force, so that one or both of the substantially void-free regions may deform or strain. If the deformed or strained region is a substantially crystalline semiconductor region, the strain may result in a modified lattice spacing and therefore a modified charge carrier mobility.

With reference to the drawings, further illustrative embodiments of the present invention will now be described in more detail, wherein it is referred to field effect transistor devices that are to receive, at least partially, a dislocation region for creating strain in their respective channel regions to enhance the drive current capability of the devices, substantially without requiring the formation of complex stress-inducing layers within the channel region. It should be appreciated, however, that the principles of the present invention may be applied to any semiconductor region requiring an increase in charge carrier mobility by an externally-provided stress source. For instance, buried semiconductor lines comprising a doped crystalline semiconductor material may be formed in accordance with the present invention to have tensile or compressive strain for increasing their conductivity.

FIG. 1a schematically shows a cross-sectional view of a semiconductor device 100 during an early manufacturing stage. The semiconductor device 100 comprises a substrate 101, which may include a first layer 102 and a second layer 103, wherein the first layer 102 may represent any appropriate material, such as a bulk semiconductor material, an insulating material and the like. The second layer 103 may represent an insulating layer, such as a silicon dioxide layer, a silicon nitride layer, or any insulating oxide or other compound of any other appropriate semiconductor material. Thus, the substrate 101 may represent any appropriate form of an insulating substrate that may be used for forming a semiconductor on insulator device, such as a silicon-on-insulator (SOI) device. The semiconductor device 100 may further comprise a semiconductor layer 104, such as a crystalline silicon layer or any other appropriate semiconductor. As previously noted, silicon is widely used in the fabrication of integrated circuits due to its good availability and relatively moderate price and its characteristics in high temperature processing, especially in combination with silicon dioxide. By means of an efficient strain engineering of the layer 104, the characteristics thereof may be adapted in accordance with device requirements, thereby rendering strained silicon a very promising approach for the development of future silicon-based semiconductor devices. For this reason, the layer 104 will be referred to as a silicon layer, even though the present invention may be practiced with any appropriate semiconductor material.

In other embodiments, the substrate 101 may represent a bulk semiconductor substrate, such as a bulk silicon substrate, wherein the silicon layer 104 is provided as the upper portion of the substrate 101, or is directly formed on the crystalline silicon of the substrate 101 by epitaxial growth. The semiconductor device 100 further comprises an implantation region 105 of a light inert species that is centered around a specified depth 106. It should be appreciated that the implantation region 105 may have a certain distribution in the vertical direction of FIG. 1a, and hence the specified depth 106 may represent the peak concentration of the light inert species. In one particular embodiment, the light inert species is substantially comprised of hydrogen. In other embodiments, the implantation region 105 may comprise helium as a light inert species. The peak concentration of the light inert species may range from approximately $10^{21}$ to $10^{23}$ atoms/cm$^3$ or even more. Although in FIG. 1a the implantation region 105 is shown to be located within the silicon layer 104, in other embodiments, when the insulating layer 103 is provided, the implantation region 105 may be located within the layer 103.

A typical process flow for forming the semiconductor device 100 as shown in FIG. 1a may comprise the following processes. The substrate 101 having formed thereon the silicon layer 104 may be obtained from wafer manufacturers or may be formed in accordance with sophisticated wafer bond techniques, as are well established in the art. Thereafter, an ion implantation process may be performed to introduce the light inert ionic species through a portion of the silicon layer 104 into the device at the specified depth 106. Depending on the depth 106 and the type of ionic species to be implanted, an appropriate implantation energy may be selected. For instance, for hydrogen and helium, corresponding implantation energies may be readily obtained by simulation calculation on the basis of available simulation algorithm programs. Especially in the case of hydrogen as the light inert species, the implantation region 105 may be relatively closely centered around the specified depth 106, since the main mechanism for stopping ions is the interaction with electrons of the silicon layer 104. Advantageously, the light inert species is implanted at a moderately high dose, such as approximately $5\times10^{15}$ to $2\times10^{16}$ ions/cm$^2$ or higher, to obtain a high concentration within the implant region 105 at a moderate implantation time. Preferably, the concentration within the implant region 105 is so high as to represent an over-critical concentration, thereby promoting the formation of "bubbles" or voids in a subsequent heat treatment, as will be described with reference to FIG. 1*d*.

Figure 1B:
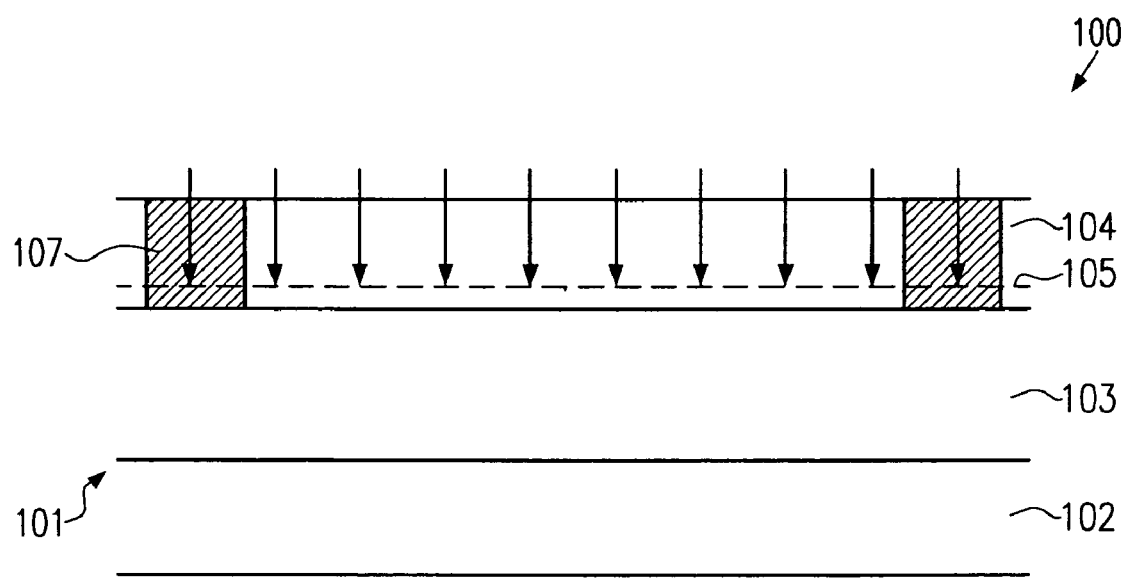

FIG. 1*b* schematically shows the semiconductor device 100 in accordance with yet another illustrative embodiment, wherein an isolation structure 107 is provided, for instance in the form of a trench isolation, which encloses the silicon region 104. The trench isolation 107 may be formed by advanced lithography, etch and deposition techniques in accordance with well-established process recipes. Thereafter, the implantation region 105 may be formed, as is described with reference to FIG. 1*a*.

Figure 1C:
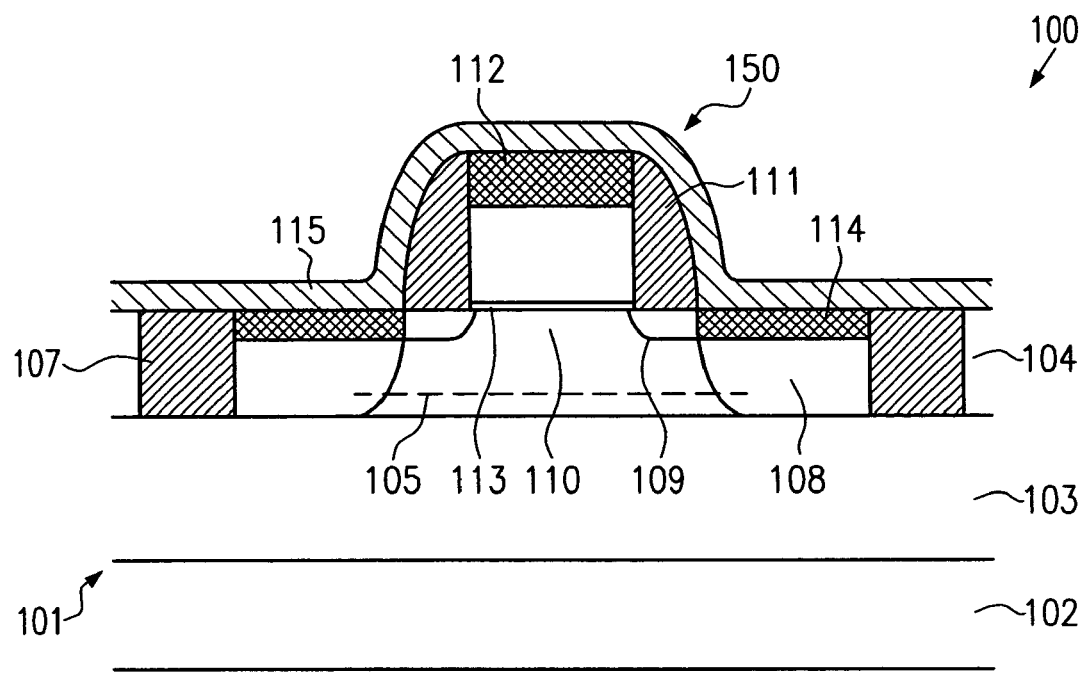

FIG. 1*c* schematically shows a cross-sectional view of the semiconductor device 100 in an advanced manufacturing stage, wherein the device 100 comprises a transistor element 150 formed on and in the silicon region 104. The transistor element 150 comprises deep source and drain regions 108 and corresponding extension regions 109, which are separated by a channel region 110. The channel region 110 may be considered as part of the silicon region 104 that is located above the implantation region 105. In other embodiments, when the implantation region 105 is formed at the interface between the insulating layer 103 and the silicon region 104, or when the implantation region 105 is located within the insulating layer 103, the channel region 110 may extend down to the insulating layer 103. It should be appreciated that the transistor element 150 illustrated in FIG. 1*c* represents a fully depleted SOI device, and other transistor architectures, such as not fully depleted SOI devices, bulk silicon devices, devices having raised drain and source regions and the like, may also be used with the present invention.

A gate insulating layer 113 is formed above the channel region 110 and separates a gate electrode 112 from the channel region 110. Spacer elements 111 are formed adjacent to sidewalls of the gate electrode 112 and metal silicide regions, such as nickel silicide, cobalt silicide and the like, may be formed on and within the gate electrode 112 and the drain and source regions 108. Finally, a stress-inducing region 115 is formed in the vicinity of the transistor element 150 and is mechanically coupled to the channel region 110, for instance via the gate electrode 112, and the drain and source regions 108. In the embodiment shown, the stress-inducing region 115 is provided in the form of a capping layer, which may also be used as an etch stop layer during a following process for etching contact openings to the drain and source regions and the gate electrode. For example, the stress-inducing region 115 may be comprised of silicon nitride that is formed to have a specified intrinsic, tensile or compressive stress.

A typical process flow for forming the device 100 as shown in FIG. 1*c* may comprise the following processes. After forming the gate insulation layer 113 by advanced deposition and/or oxidation techniques, the gate electrode 112 may be formed by deposition of a gate electrode material, such as polysilicon, by low pressure chemical vapor deposition and a subsequent sophisticated photolithography and etch procedure in accordance with well-established process recipes. Thereafter, implantation processes may be performed for forming the extension regions 109 and/or any pre-amorphization implantations may be performed as required. Afterwards, the spacer elements 111 may be formed, for instance on the basis of silicon dioxide and silicon nitride, wherein, in some embodiments, the process for forming the spacers 111 may be designed such that a specified amount of stress is created in the spacers 111. For example, a thin oxide liner may be deposited followed by the deposition of a silicon nitride layer of specified thickness and, if desired, of specified tensile or compressive stress. For instance, during a plasma enhanced chemical vapor deposition (PECVD) process for depositing the silicon nitride layer, the ion bombardment may be controlled to obtain a desired intrinsic stress. Thereafter, the silicon nitride layer may be etched in accordance with anisotropic etch processes, thereby leaving the sidewall spacers 111 having the desired intrinsic stress. Thereafter, further implantation processes may be performed to create the deep source and drain regions 108.

It should be appreciated that other process flows may be used in forming the drain and source regions 108 and the corresponding extension regions 109. For instance, disposable sidewall spacers (not shown) may be used to first form the deep source and drain regions 108 and then remove the disposable spacers prior to or after a corresponding anneal step to activate the dopants in the drain and source regions 108. Thereafter, the extension regions 109 may be formed and activated by an anneal process at a lower temperature. Afterwards, the spacers 111 may be formed. Irrespective of the process sequence used, during the implantation for the deep source and drain regions, possibly in combination with a pre-amorphization implantation, the light inert species in the implantation region 105 may be redistributed within the source and drain regions 108 or may even be at least partially driven out from the silicon region 104 during any anneal cycles for activating dopants in the source and drain regions 108 and the extension regions 109. At any rate, at least a portion of the implantation region 105 is maintained within the channel region 110 or in the vicinity thereof, when the implantation region is located in the insulating layer 103, wherein the specified depth 106 is substantially maintained although a certain broadening of the distribution around the depth 106 of the light inert species may take place during the various anneal cycles. Moreover, in some embodiments, a moderately high, that is, over-critical, concentration of the light inert species within the implantation region 105 may be provided and the species may already start creating bubbles or voids at the depth 106 during the dopant activation, similarly as bubbles are formed in an over-saturated fluid including a gaseous component upon occurrence of a disturbance.

Thereafter, the metal silicide regions 114 may be formed by depositing a refractory metal and initiating a chemical reaction with the underlying silicon in the drain and source regions 108 and the gate electrode 112. Thereafter, the stress-inducing region 115, for instance in the form of a capping layer or etch stop layer, may be formed, for example as a silicon nitride layer, wherein deposition parameters for forming the layer 115 may be adjusted to obtain a desired amount of tensile or compressive stress. As is readily known, silicon nitride may be deposited by a PECVD process, wherein one or more process parameters, such as the bias power, the temperature and the like, may be adjusted to obtain compressive or tensile stress within a wide range of approximately 0-800 MPa for tensile or compressive stress. During the formation of the metal silicide regions 114 and the stress-inducing region 115, again, elevated process temperature may possibly lead to a further generation of voids or bubbles within the implantation region 105, depending on the initially implanted concentration.

Figure 1D:
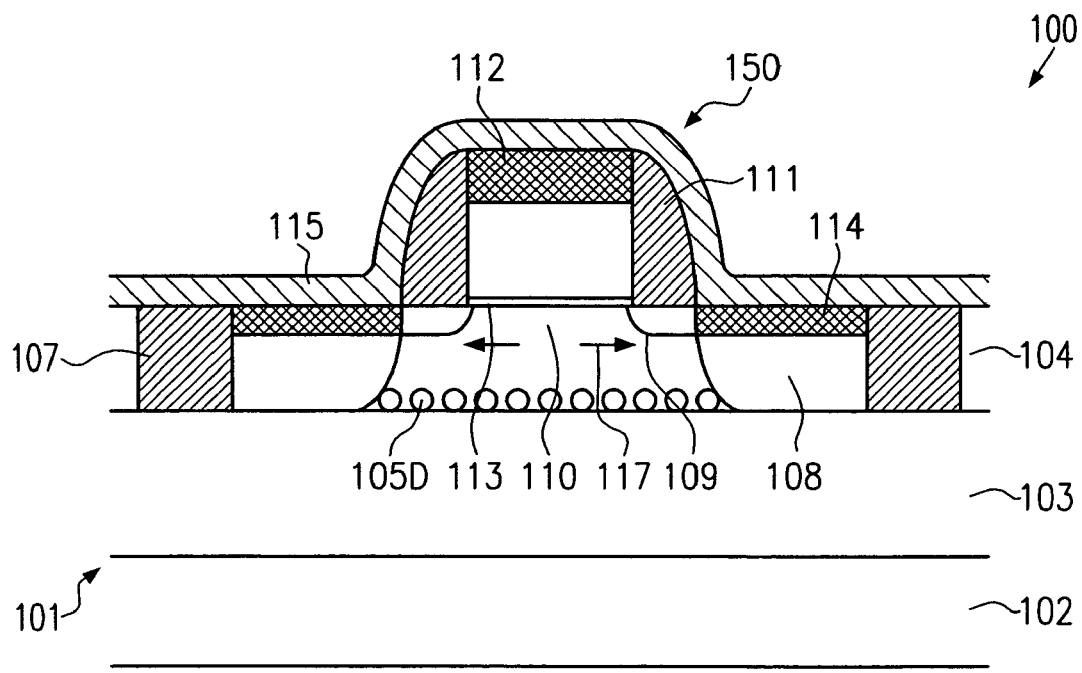

FIG. 1*d* schematically shows the semiconductor device 100 with a dislocation region 105*d* including a plurality of bubbles or voids 116 that are substantially filled with the light inert species and that are substantially centered around the specified depth 106. The bubbles 116, which may have a size in the range of nanometers, and which may have formed partially during the preceding anneal cycles, may be formed by a heat treatment with temperatures in the range of approximately 350-1000° C., and typically at approximately 700-950° C. for a time period of several minutes if the light inert species is hydrogen and the implantation region 105 is substantially located within the silicon region 104. If the implantation region 105 is, for example, located within the insulating layer 103, other parameters for the heat treatment may be appropriate and may be readily determined on the basis of test runs. If helium is used as the light inert species, a temperature of approximately 350° C. may lead to a void generation, irrespective of whether the implantation region 105 is formed within the silicon region 104 or the insulating layer 103. Typically, a temperature of approximately 700-950° C. for several minutes may be used. The above-specified values may depend on the initially implanted peak concentration and may be suitable for a concentration in the range of approximately $10^{21}$-$10^{23}$ atoms/cm$^3$. Typical implantation parameters may be approximately 3-15 keV, depending on the desired penetration depth with a dose of approximately $5\times10^{15}$ to $2\times10^{16}$ ions per cm$^2$. Appropriate process parameters for forming the dislocation region 105d in silicon, silicon dioxide and the like may readily be established by fabricating one or more test substrates and investigating the formation of bubbles or voids for various peak concentrations, materials, heat treatment parameters and the like, or the strain finally obtained above the corresponding dislocation region by the application of a specified external stress. The results or the finally obtained strain may be used to establish a correlation between at least one process parameter in forming the dislocation region 105d and the finally obtained strain. The strain may be determined by, for example, measuring the conductivity of a semiconductor region, which depends on the charge carrier mobility and thus the strain existing in the semiconductor region.

Based on the above considerations, a specified strain 117 may be induced within the channel region 110 by the stress-inducing region 115. As previously explained, the dislocation region 105d weakens the mechanical coupling of the channel region 110 to the lower lying device regions, such as the insulating layer 103, thereby providing the potential that the channel or at least a portion thereof may more readily deform upon the application of an external force, such as that created by the stress of the layer 115, as is the case without the dislocation region 105d. It should be appreciated that the finally obtained strain 117 may be controlled by adjusting the stress in the region 115 and in other stress-inducing regions that may be mechanically coupled to the channel region 110, such as the spacers 111 and the metal silicide regions 114, and by the parameters influencing the implantation region 105 or the dislocation region 105d, such as the implantation parameters, the heat treatment parameters and the like. For example, the finally obtained strain 117 may be adjusted by selectively controlling the characteristics of the dislocation region 105d at different areas of the semiconductor device 100. That is, for a given process flow for forming the transistor elements 150, one or more implantation parameters for forming the implantation region 105 may be varied to obtain a dislocation region 105d having a different characteristic in different areas, thereby resulting in a different strain 117 at the different device areas.

With reference to FIGS. 2a-2b, illustrative embodiments for varying the characteristics of a dislocation region will be described in more detail. FIG. 2a schematically shows a semiconductor device 200 comprising a substrate 201 that may include a first layer 202 and a second layer 203, similarly as the device 100 shown in FIG. 1a. A first semiconductor region 204a and a second semiconductor region 204b may be formed above the substrate 201, wherein the second semiconductor region 204b may be covered by a mask 220, provided, for instance, as a resist mask adapted to substantially prevent a light inert species from penetrating the second semiconductor region 204b during an ion implantation process. A first implantation region 205a is formed within the first semiconductor region 204a, while a second implantation region 205b is formed within the second semiconductor region 204b. The second implantation region 205b may be substantially void of any light inert species, or may have a different concentration of the lightly doped species introduced during an implantation 230 due to the resist mask 220. For example, in order to create a reduced concentration of a light inert species or to provide a different light inert species in the second implantation region 205b, the implantation 230 may be preceded by a further implantation with the first semiconductor region 204a covered or not covered to provide for a difference between the regions 205a and 205b. In this way, any desired difference in concentration and/or type of inert species may be created in the implantation regions 205a and 205b. In the following, it is assumed that no further implantation process has taken place and the second implantation region 205b may comprise substantially no implanted light inert species. Regarding implantation parameters, the location of the implantation region 205a and the like, the same criteria apply as previously explained with reference to FIG. 1a.

FIG. 2b schematically shows the semiconductor device 200 comprising two transistor elements 250a and 250b formed on and in the first and second semiconductor regions 204a and 204b, respectively. The transistor elements 250a and 250b may be formed in accordance with well-established process strategies, such as the process flow described with reference to the transistor element 150 shown in FIGS. 1c and 1b. The device 200 further comprises a stress-inducing layer 215 formed over the first and second transistor elements 250a and 250b, and with a dislocation region 205d formed within a channel region 210 of the first transistor element 250a. Further components of the transistors 250a and 250b are similar to the device 150 and are denoted by the same reference signs, except for a leading "2" instead of a "1." The dislocation region 205d may be formed in accordance with the processes already explained with reference to FIG. 1d, wherein the second transistor 250b substantially lacks a corresponding dislocation region when the implantation region 205b comprises substantially no light inert species within the second semiconductor region 204b. In other cases, the difference between the implantation regions 205a and 205b, when both regions include a light inert species, may lead to corresponding dislocation regions 205d that provide a different mechanical decoupling after heat treating the device 200. For example, the peak concentration of the implantation region 205a may be selected significantly higher than in the second implantation region 205b so that a common heat treatment results in a more efficient weakening of bonds in the dislocation region corresponding to the implantation region 205a compared to dislocation region corresponding to the implantation region 205b of the second transistor element 250b. Hence, the single stress-inducing layer 215 may produce a different amount of strain in the first transistor element 250a and the second transistor element 250b. Thus, the strain engineering may be performed differently for different types of transistors and/or different substrate areas.

In other embodiments, the characteristics of the stress-inducing regions may be varied in different device areas to obtain a different amount of strain. Illustrative examples will be described with reference to FIGS. 3a and 3b. FIG. 3a schematically shows a semiconductor device 300 including a first transistor element 350a and a second transistor element 350b having the same components as the devices shown in FIG. 2b, which are denoted by the same reference signs, except for a leading "3" instead of a "2." Moreover, each transistor element comprises a substantially identical dislocation region 305d. Furthermore, a first stress-inducing region 315a mechanically coupled to the first transistor element 350a and a second stress-inducing region 315b mechanically coupled to the second transistor 350b are provided. A resist mask 320 covers the second transistor element 350b during an ion bombardment 330. Regarding the manufacturing of the transistor devices 350a and 350b, the same criteria apply as previously explained with reference to the transistors 150 and 250. Moreover, the dislocation regions 305d may be formed as explained with reference to FIGS. 1a-1d, wherein substantially identical process conditions are provided for the first and second transistor elements 350a, 350b, to result in substantially identical dislocation regions 305d. The first and second stress-inducing regions 315a and 315b may be formed initially as a dielectric layer, such as a silicon nitride layer, exhibiting a specified initial intrinsic stress, wherein the intrinsic stress may be relaxed, at least partially, by the ion bombardment 330 to obtain a substantially relaxed region 315a. The ion bombardment 330 may be carried out with, for example, xenon ions with an appropriate implantation energy and dose. Thereafter, the resist mask 320 may be removed and a second stress-inducing layer may be formed above the layer portions 315a and 315b.

FIG. 3b schematically shows the device 300 after the formation of the second stress-inducing layer and after a further ion bombardment 331 with a further resist mask 321, which now covers the first transistor element 350a. A layer portion 345b formed above the layer 315b is substantially relaxed by the ion bombardment 331 so that the total stress created by the layers 315b and 345b is substantially determined by the layer 315b. Similarly, a layer portion 345a having a specified intrinsic stress is formed above the substantially relaxed layer portion 315a so that the total stress created in the first transistor element 350a is substantially determined by the layer portion 345a. Due to the dislocation regions 305d, the different stresses may effectively be transferred into the corresponding channel regions and create there respective strains 317a and 317b that are different. The strains 317a and 317b may be correspondingly adjusted without requiring a modification in the process flow for forming the dislocation regions 305d. Hence, the strain for different transistor types and/or device regions may be adjusted by designing the stress of respective stress-inducing regions.

It should be appreciated, however, that the techniques for providing different strain at different device areas and/or for different transistor types described with reference to FIGS. 2a-2b and 3a-3b may be readily combined in any desired fashion to even more effectively adapt the finally obtained strain.

Figure 4A:
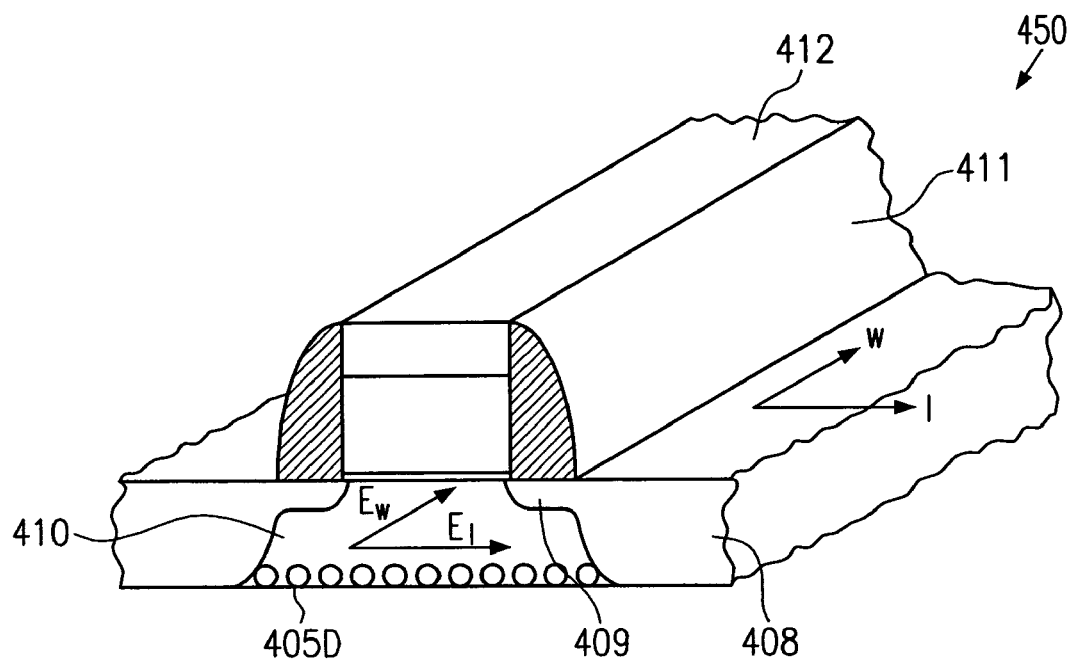
FIGS. 4a-4b schematically show a semiconductor device in which a directed strain is created by means of a dislocation region in accordance with further illustrative embodiments.

FIG. 4a schematically shows a perspective view of a transistor element 450 including a gate electrode 412 with sidewall spacers 411 formed thereon. Below and adjacent to the gate electrode 412, extension regions 409 and deep source and drain regions 408 are formed. In a channel region 410 is located a dislocation region 405d. The transistor 450 has a width extending along a width direction W, and the transistor also has a length extending along a length direction L. In typical simulation calculations for modeling a three-dimensional strain in the channel region 410, generally a strain $E_W$ acting along the width direction increases the transistor performance when the strain $E_W$ is changed towards a more tensile strain, irrespective of whether a P-channel transistor or an N-channel transistor is considered. Hence, in some embodiments, it may be advantageous to provide a stress-inducing region that substantially creates strain in the transistor width direction to enhance transistor performance for any transistor type.

Figure 4B:
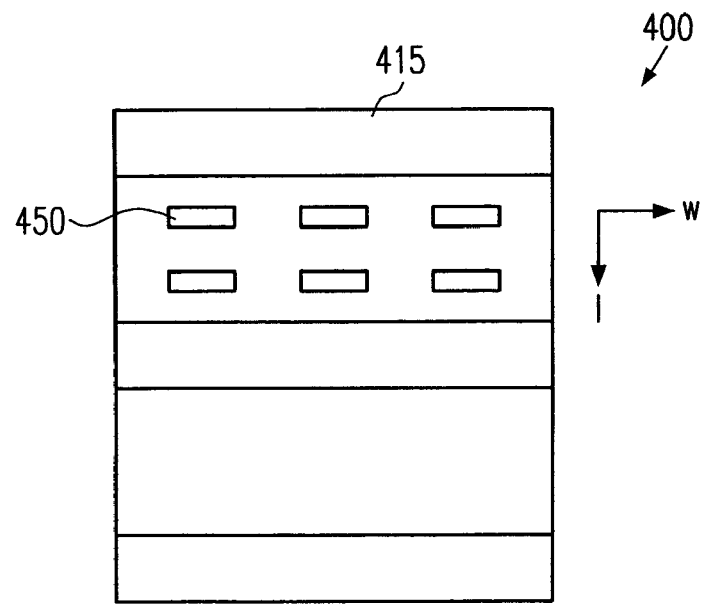

FIG. 4b schematically shows a plan view of a semiconductor device 400 comprising a plurality of transistor elements 450 that are oriented in a substantially identical way. Moreover, stress-inducing regions 415 are provided, which have a significantly larger size in the transistor width direction than in the transistor length direction. Consequently, the regions 415 may create preferably stress along the transistor width direction, even though the intrinsic stress in the regions 415 may be isotropic. As explained above, it is advantageous to provide the regions 415 with intrinsic tensile stress to create a tensile strain component in the transistor width direction, thereby enhancing the transistor performance. Due to the effective transfer of stress into strain by means of the dislocation region 405d, the carrier mobility in the plurality of transistor elements 450 may be significantly increased.

It should be appreciated that, especially in the above-described embodiments of FIGS. 4a and 4b, the regions 415 may not necessarily be configured to permanently induce stress and thus strain within the channel region 410. In some embodiments, it may be considered advantageous to form the regions 415 such that the stress induced by them may be varied in accordance with specified requirements. For example, the regions 415 may be formed in the vicinity of heat sinks and may have a coefficient of thermal expansion that causes a significant variation with temperature so that the stress induced varies with the operating temperature of the device 400. In this way, temperature-induced effects may be compensated for or may be reduced, or, in other cases, temperature dependent performance variations may be imparted to the device 400. In other embodiments, the stress-inducing regions 415 may be configured to be switchable, for instance by intentionally heating the regions 415 or an area located close to the regions 415, for example, by conducting current, thereby controlling the thermal expansion of the regions 415.

Moreover, as previously described with reference to FIGS. 2a, 2b, 3a and 3b, the transistor performance of different device areas may effectively be controlled by varying the characteristics of the respective dislocation regions and/or the characteristics of the respective stress-inducing regions. In this way, across-substrate non-uniformities in device performance or across-chip non-uniformities of device performance may be compensated for or at least significantly reduced, thereby significantly increasing production yield for a specified type of semiconductor device with required specifications.

Moreover, in some embodiments, the anneal cycles during the formation of a transistor element may be considered inappropriate with respect to a "premature" nano-void generation in respective implantation regions, such as the regions 105, 205 and 305. In this case, hydrogen may be implanted at a later manufacturing stage, for instance after completion of the drain and source regions. Hereby, the implantation energy may be selected to locate the hydrogen ions at a desired depth below the gate electrode, while the ions may penetrate deeply into the device region below the drain and source regions. The crystal damage caused by the hydrogen implantation may be negligible and may be cured during the heat treatment for forming the dislocation region from the implanted hydrogen ions.

As a result, the present invention provides a new technique that enables the formation of a dislocation region in the vicinity of a semiconductor region, the carrier mobility of which is to be adjusted by an external stress-inducing source. The dislocation region, which effectively reduces the mechanical coupling of the semiconductor region, such as a channel region, to adjacent device or substrate regions, may be formed by introducing a light inert species, such as hydrogen, into a specified device region and by an appropriate heat treatment to create a certain "separation" or micro-cleavage between the channel region and the lower lying device or substrate region. Therefore, an effective strain engineering may be enabled based on the dislocation region, wherein the strain obtained may be provided as tensile or compressive strain with a desired magnitude in that the characteristics of the dislocation region and/or the characteristics of the external stress-inducing source are correspondingly adjusted. Moreover, the strain may be adjusted differently for different device areas.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a first semiconductor region above a substrate;
   forming a first dislocation region in a first region of at least one of said substrate and said first semiconductor region, said first dislocation region enabling a relative motion on an atomic scale between said substrate and at least a first portion of said first semiconductor region, said first dislocation region being formed by implantation of a first light ion species at a first concentration level and heat treatment;
   forming a first stress-inducing region mechanically coupled to said first portion of said semiconductor region, said first stress-inducing region creating a first strain in said at least a first portion of the semiconductor region;
   providing a second semiconductor region above said substrate that does not overlap said first semiconductor region;
   forming a second dislocation region in a second region of at least one of said substrate and said second semiconductor region, said second dislocation region enabling a relative motion on an atomic scale between said substrate and at least a second portion of said second semiconductor region, said second dislocation region being formed by implantation of the first light inert species at a second concentration level different than the first concentration level and heat treatment, wherein said implantation for said second dislocation region differs from said implantation for said first dislocation region to provide different levels of relative motion in said first and second dislocation regions; and
   forming a second stress-inducing region mechanically coupled to said second portion of said second semiconductor region, said second stress-inducing region creating a second strain in said at least a portion of the second semiconductor region, said second strain differing from said first strain.

2. The method of claim 1, wherein said first light inert species is implanted into said first or second semiconductor regions to be centered around a predetermined depth.

3. The method of claim 2, wherein said first light inert species comprises hydrogen.

4. The method of claim 2, wherein said first light inert species comprises helium.

5. The method of claim 1, wherein forming the first stress-inducing region comprises forming a first dielectric region adjacent to said first semiconductor region, said first dielectric region having a first specified intrinsic stress.

6. The method of claim 5, wherein forming the second stress-inducing region comprises forming a second dielectric region adjacent to said second semiconductor region, said second dielectric region having a second specified intrinsic stress.

7. The method of claim 1, further comprising forming a drain region and a source region in said first semiconductor region.

8. The method of claim 7, further comprising forming a trench isolation enclosing said drain region and said source region.

9. The method of claim 8, wherein said first light inert ion species is implanted prior to forming said trench isolation.

10. The method of claim 8, wherein said first light inert ion species is implanted after forming said trench isolation.

11. The method of claim 1, further comprising forming a first transistor element at least partially in said first semiconductor region, wherein said first dislocation region is formed after forming said first transistor element.

12. The method of claim 11, wherein forming said first dislocation region comprises implanting the first light inert ion species to form an inert implant region at a specified depth and heat treating said inert implant region to form said first dislocation region at said specified depth.

13. The method of claim 12, wherein heat treating said inert implant region is performed after forming said first transistor element.

14. The method of claim 11, further comprising forming a second transistor element at least partially in said second semiconductor region.

15. The method of claim 1, further comprising masking said second semiconductor region during introducing said first light inert species to substantially prevent said light inert species from penetrating said second semiconductor region.

16. The method of claim 1, further comprising controlling at least one process parameter during the formation of at least one of said first or second dislocation regions to adjust a degree of said relative motion.

17. The method of claim 16, wherein said at least one process parameter is an implantation parameter.

18. The method of claim 1, wherein forming the first and second dislocation regions comprises:
   forming a mask over at least a portion of said second region while exposing at least a portion of said first region; and
   implanting the first light inert species using a common implantation process, said mask reducing the second concentration level relative to the first concentration level.

19. The method of claim 1, wherein forming the first and second dislocation regions comprises:
   implanting the first light inert species in at least one of the first and second regions using a first implantation process;
   forming a mask over at least a portion of said first region while exposing at least a portion of said second region; and
   implanting the first light inert species into at least said second region using a second implantation process.

20. A method, comprising:
providing a first semiconductor region above a substrate;
forming a first dislocation region in a first region of at least one of said substrate and said first semiconductor region, said first dislocation region enabling a relative motion on an atomic scale between said substrate and at least a first portion of said first semiconductor region, said first dislocation region being formed by implantation of a first light ion species and heat treatment;
forming a first stress-inducing region mechanically coupled to said first portion of said semiconductor region, said first stress-inducing region creating a first strain in said at least a first portion of the semiconductor region;
providing a second semiconductor region above said substrate that does not overlap said first semiconductor region;
forming a second dislocation region in a second region of at least one of said substrate and said second semiconductor region, said second dislocation region enabling a relative motion on an atomic scale between said substrate and at least a second portion of said second semiconductor region, said second dislocation region being formed by implantation of a second light inert species different from the first light inert species and heat treatment, wherein said implantation for said second dislocation region differs from said implantation for said first dislocation region to provide different levels of relative motion in said first and second dislocation regions; and
forming a second stress-inducing region mechanically coupled to said second portion of said second semiconductor region, said second stress-inducing region creating a second strain in said at least a portion of the second semiconductor region, said second strain differing from said first strain.

21. The method of claim 20, wherein said first light inert species is implanted into said first semiconductor region to be centered around a first predetermined depth and said second light inert species is implanted into said second semiconductor region to be centered around a second predetermined depth.

22. The method of claim 20, wherein one of said first and second light inert species comprises hydrogen.

23. The method of claim 20, wherein one of said first and second light inert species comprises helium.

24. The method of claim 20, wherein forming the first stress-inducing region comprises forming a first dielectric region adjacent to said first semiconductor region, said first dielectric region having a first specified intrinsic stress.

25. The method of claim 24, wherein forming the second stress-inducing region comprises forming a second dielectric region adjacent to said second semiconductor region, said second dielectric region having a second specified intrinsic stress.

26. The method of claim 20, further comprising forming a drain region and a source region in said first semiconductor region.

27. The method of claim 26, further comprising forming a trench isolation enclosing said drain region and said source region.

28. The method of claim 27, wherein said first and second light inert ion species are implanted prior to forming said trench isolation.

29. The method of claim 27, wherein said first and second light inert ion species are implanted after forming said trench isolation.

30. The method of claim 20, further comprising forming a first transistor element at least partially in said first semiconductor region, wherein said first dislocation region is formed after forming said first transistor element.

31. The method of claim 30, further comprising forming a second transistor element at least partially in said second semiconductor region.

32. The method of claim 20, further comprising masking said second semiconductor region during introducing said first light inert species to substantially prevent said first light inert species from penetrating said second semiconductor region.

33. The method of claim 20, further comprising controlling at least one process parameter during the formation of at least one of said first or second dislocation regions to adjust a degree of said relative motion.

34. The method of claim 33, wherein said at least one process parameter is an implantation parameter.

35. The method of claim 20, wherein forming the first and second dislocation regions comprises:
forming a first mask over at least a portion of said second region while exposing at least a portion of said first region;
implanting the first light inert species using a first implantation process;
removing the first mask;
forming a second mask over at least a portion of said first region while exposing at least a portion of said second region; and
implanting the second light inert species using a second implantation process.

* * * * *